United States Patent [19]
Lebailly et al.

[11] 3,977,016
[45] Aug. 24, 1976

[54] ELECTROLUMINESCENT DEVICE AND METHOD OF MANUFACTURING SAME

[75] Inventors: Jacques Lebailly, Caen; Daniel Diguet, Herouville-St-Clair, both of France

[73] Assignee: U.S. Philips Corporation, New York, N.Y.

[22] Filed: Aug. 4, 1975

[21] Appl. No.: 601,813

Related U.S. Application Data
[63] Continuation of Ser. No. 377,890, July 10, 1973, abandoned.

[30] Foreign Application Priority Data
July 12, 1972  France .................. 72.25286

[52] U.S. Cl. ................................. 357/17; 357/48; 357/49; 357/90
[51] Int. Cl.² ............................... H01L 33/00
[58] Field of Search ............ 357/17, 18, 48, 49, 357/90

[56] References Cited
UNITED STATES PATENTS
3,617,820  11/1971  Herzog .......................... 317/234

*Primary Examiner*—Martin H. Edlow
*Attorney, Agent, or Firm*—Frank R. Trifari; Leon Nigohosian

[57] ABSTRACT

A device having an electroluminescent diode of which the two regions have a homogeneous concentration of one type of doping centers.

The doping centers of the opposite type have a concentration which decreases towards the emissive surface from the junction. Manufacture of the diode by out-diffusion.

Application to devices having electroluminescent diodes with compounds III–V.

7 Claims, 4 Drawing Figures

ELECTROLUMINESCENT DEVICE AND METHOD OF MANUFACTURING SAME

This is a continuation of application Ser. No. 377,890, filed July 10, 1973, now abandoned.

The present invention relates to an electroluminescent simiconductor device comprising a *p-n* junction diode of which the regions on either side of the said junction have a substantially equal concentration of doping centres giving a first conductivity type and a concentration gradient of doping centres giving the second conductivity type.

The electroluminescent *p-n* junction diodes have a luminous efficiency which depends inter alia on the internal efficiency and the absorption of the radiation emitted between the emissive zones and the surface of the device. In order to improve the internal efficiency it is of interest to favour the injection of minority charge carriers through the junction and to favour the recombination in volume rather than in surface: a junction having a very weak or low concentration gradient is advantageous. In order to diminish the absorption it is of interest to have a minimum concentration and a very weak gradient in the region traversed by the radiation. The known electroluminescent diodes do not fulfill the above conditions in an optimum manner; they are, actually, usually manufactured by diffusion of an impurity in a material which was originally doped in a homogeneous manner by means of an impurity of the opposite type, as a result of which the diffused region is more highly doped in the body of the diode. On the other hand, the epitaxial method does in general not permit of obtaining directly gradual junctions of weak concentration gradients.

It is the object of the invention to mitigate the drawbacks of the so far known electroluminescent diodes and to provide a device having an electroluminescent diode with a gradual *p-n* junction favourable for the injection of minority charge carriers in the region of radiative recombinations and presenting a minimum absorption in particular in said latter region.

According to the invention, the electroluminescent semiconductor device comprises a *p-n* junction diode of which the regions on eiher side of the said *p-n* junction have a substantially equal concentration of doping centres giving a first conductivity type and a cencentration gradient of doping centres giving the second conductivity type, where, in the region adjoining the light emanating surface of the device, the concentration of doping centres giving the second conductivity type slightly decreases from the said junction in the direction of the said surface.

As a result of the weak concentration gradient of doping centers of the second type associated with the substantially uniform concentration of centers of the first type, the junction is very gradual. Said junction profile is favourable for the injection through the junction of minority charge carriers producing the radiative recombinations in one or the other region.

Since the concentration of doping centers of the second type decreases from the junction in the direction of the emissive surface, the conductivity type of the region adjoining said surface, or surface region, is imposed by the doping centres of the first type of which the substantially uniform concentration may be relatively low, the minimum concentration in it being only imposed by the necessities of making contacts. The surface region traversed by the emitted light is thus doped to a low level and presents a minimum absorption.

The concentration gradient of doping centres giving the second type may be over a whole face of the crystal or only a part of said face, the device presenting in the latter case a localized junction.

The present invention also relates to the manufacture of electroluminescent devices, in particular display devices and photocouplers.

From the following description with reference to the accompanying drawings it will be well understood how the invention can be carried into effect.

It is to be noted that in the Figures the proportions and dimensions of the various devices have not been respected and that the thicknesses in particular are strongly exaggerated for a better understanding.

Figure 1:
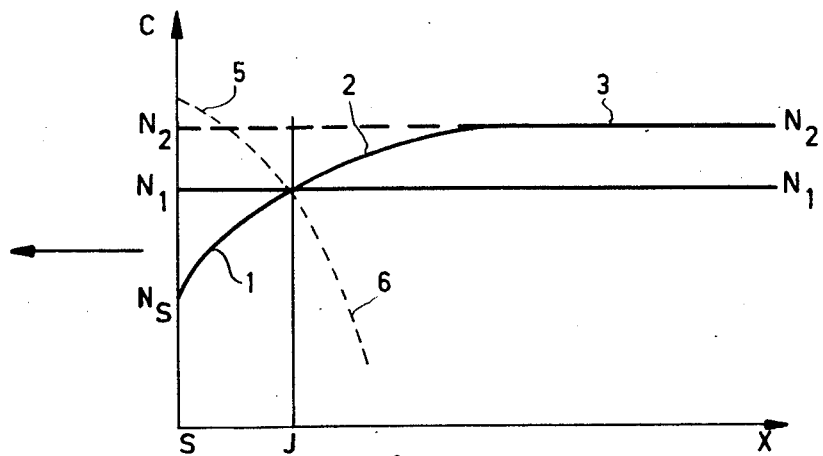
FIG. 1 is a diagram showing the concentration profile of doping centres of a device according to the invention.

FIG. 1 is a diagram showing the concentrations of doping centres in the two regions of an electroluminescent diode according to the invention. A first type of doping centre with a concentration $N_1$ which is substantially constant is present throughout the thickness of the two regions of the diode. The solid-line-curve 1-2-3 of the concentration of doping centres of the second type, as a function of the depth X taken from the surface of emission S, shows that in the surface region of the diode between the surface S and the junction J the concentration of the doping centres of the second type is decreasing in the direction of the surface and that the doping centres of the second type are minority centres. In the zone near the junction the gradient is small, one has a junction which is substantially linear with a weak gradient, favourable for the phenomenon of electroluminescence. The surface concentration $N_S$ of the doping centres of the second type is not very high and the surface concentration $N_1$ of the doping centres of the first type is the minimum admissible concentration to obtain ohmic connection contacts which do not show too high a resistance. The light emitted in the zone near the junction J emanates through the surface S after having traversed the surface region which has an absorption which is lower than in the known electroluminescent diodes of which the curve 5-6 in broken lines gives an example of the concentration gradient of carriers of the second type, the carrier concentration of the first type being $N_1$.

In a first preferred embodiment of the invention (whose doping impurity concentration is exemplified by FIG. 1), the *p-n* junction dode has a homogeneous concentration of doping centers, the surface region has a concentration of acceptor centers decreasing (e.g., line 1) towards the surface and the second region of the diode has a concentration of acceptor centers (e.g., lines 2–3) higher than that of the donor centers.

In this embodiment, the surface region is of the *n* type. Said device is favorable in the case in which the diode is manufactured from a semiconductor material comprising at least one element from the group III of the periodic table of elements and at least one element of group V, for example, gallium arsenide. Actually, in said materials, and in particular in the case of a direct band structure, the gradual structure is in this embodiment particularly favorable to inject electrons in the $p$ type region where the probability of radiative recombination is greatest.

In a second embodiment of the invention, the $p$-$n$ junction diode has a homogeneous concentration of acceptor centers, the surface region has a concentration of donor centers decreasing (e.g., line 1 of FIG. 1) towards the surface and the second region of the diode has a concentration of donor centers (e.g., lines 2–3) higher than that of the acceptor centers.

In this embodiment, the surface region is of the $p$ type. This arrangement is favorable in the case in which the diode is manufactured from semiconductor material of which the $p$ type is luminescent, such as certain materials comprising at least one element of group III and at least one element of group V. The radiative recombinations are made in volume, the surface recombinations being not radiative. The part of the surface region of the $p$ type nearest to the junction is most highly doped and the probability of recombinations is greatest in it. On the other hand, the part of the surface region nearest the surface is least doped and the absorption of light which it produces is minimum.

In the two above-mentioned embodiments, the second region of the diode may have a substantially homogeneous concentration of doping centers giving the second type, at least in the greater part of its thickness, as is the case when said concentration is obtained during the growth of the crystal, either during the formation of a rod, or during an epitaxial deposit.

The second region of the diode may also be obtained by diffusion and may have in this case a concentration gradient of said same doping centers; for example, when the device must comprise a third region underneath the second region and of the same type as the surface region.

Figure 2:
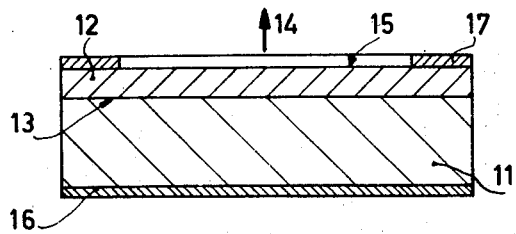
FIG. 2 is a diagrammatic cross-sectional view of an electroluminescent device according to the invention.

The diagrammatic sectional view of FIG. 2 shows an electroluminescent diode comprising two regions 11 and 12 separated by a junction 13, the light emitted in the vicinity of the junction 13 emanating through the emissive surface 15 in the direction 14. Contacts 16 and 17 are disposed on the surfaces of the two regions 11 and 12 for the polarisation of the diode.

The diode as shown in FIG. 2 has, for example, a concentration diagram of doping centres which is identical to the diagram of FIG. 1. Said diode is manufactured from gallium arsenide, the concentration $N_2$ is $10^{18}$ atoms of zinc per $cm^3$, the concentration $N_1$ is $2\times10^{17}$ atoms per $cm^3$, the concentration $N_S$ is $10^{17}$ atoms of zinc per $cm^3$. The junction 13 is at 7 microns from the surface 15.

The diode of FIG. 2 may be manufactured by out-diffusion from a plate of gallium arsenide comprising uniform concentrations $N_1$ and $N_2$ obtained, for example, by incorporation during the growth of a bar, or during the growth of an epitaxial deposit on a strongly doped substrate of the same type as the region 11. The out-diffusion treatment is carried out, after etching the surface 15 by heating at 800°C for 1 to 5 hours in a closed ampoule which is previously evacuated and in which an atmosphere of arsenic is maintained at a pressure below 1 atmosphere.

Figure 3:
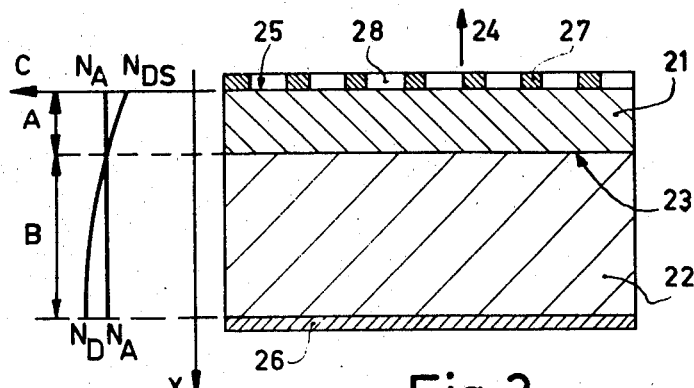
FIG. 3 is a diagrammatic sectional view of another electroluminescent device according to the invention.

Another example of a diode according to the invention is shown in FIG. 3. The diode is formed by the regions 21 of the $p$ type and 22 of the $n$ type between which the junction 23 is present. The light emitted in the vicinity of the junction emanates at 24 through the windows 28 formed in the contact grid 27, a contact 26 being moreover provided on the region 22. Beside the diagrammatic sectional view of the diode a diagram of the concentration C of doping centres according to the thickness X of the plate is shown. The concentration of acceptor centres $N_A$ is constant throughout the thickness of the diode, the acceptor centres are majority centres throughout the thickness A of the region 21. The concentration of the donor centres varies from $N_D$ to $N_A$ in thickness B of the region 22 where they are majority centres and from $N_A$ to $N_{DS}$ in the thickness A of the region 21.

The diode shown in FIG. 3 may be manufactured by out-diffusion. Starting from a rod of gallium arsenide of $n$ type conductivity obtained by growth according to the Bridgmann method with a doping of silicon in a concentration of $5\times10^{17}$ atoms per $cm^3$, in which a certain number of plates are included, the conductivity type of the material is inverted at a depth of 8 microns by a treatment in a closed ampoule at 850°C for 2 hours.

In a variation of the embodiment of the device according to the invention (e.g., as exemplified in FIG. 4), the surface layer of the region adjoining the surface has a strong concentration of doping centers giving the first conductivity type over a comparatively very small thickness, said strong concentration being higher than that of the doping centers throughout the thickness of the two regions of the diode. The characteristic features of making contact on the surface region may be improved in it.

Figure 4:
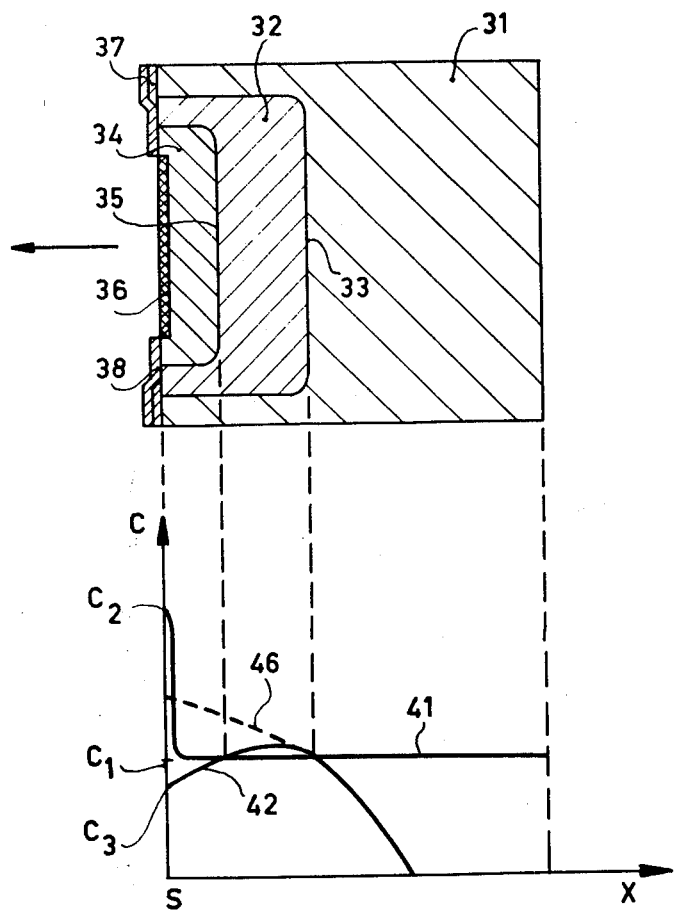
FIG. 4 is a diagrammatic sectional view of a third device according to the invention.

The device shown in FIG. 4 comprises three regions 31, 32 and 34 the concentration profiles of doping centres of which are given with respect to the diagrammatic sectional view of the device. The impurity concentration of a first type, constituting, for example, donor centres, is constant throughout the thickness of the device and equal to $C_1$, with the exception of a thin surface layer 36 having a strong concentration $C_2$ obtained, for example, for ion implantation. The curve 41 indicates the concentration profile of said first impurity. The concentration of impurities of the second type, constituting acceptor centres, varies according to curve 42 which intersects the curve 41 at two points corresponding to the junctions 33 and 35. In accordance with the invention, the concentration of donor centres giving the second conducitivity type slightly decreases from the junction in the direction of the surface 36. The surface concentration of impurities of the second type is only $C_3 < C_1$. The profile corresponding to the curve 42 may be obtained by a first diffusion from which results a profile according to curve 46 succeeded by an out-diffusion. The diffusion operation in the case of the device shown is an operation which is localized by means of an oxide mask 37. The out-diffusion operation is also an operation localized by means of an adequate oxide mask 38 which may be different from diffusion mask 37.

An electroluminescent device according to the invention may be manufactured by following a method comprising the usual operations belonging to known technologies used in the manufacture of semiconductor devices.

A preferred embodiment of manufacturing a device according to the invention in one of the embodiments described above consists notably in taking a monocrystalline plate which is uniformly doped with a first impurity giving a first conductivity type, with a concentration $N_1$, and of a second impurity giving the opposite conductivity type, with a concentration $N_2 > N_1$, out-diffusing the said second impurity from at least a part of a large plane surface of said plate, said latter impurity being chosen due to its higher out-diffusion rate than that of the first impurity. The method of out-diffusion permits actually of obtaining, with a suitable choice of the materials, a gradual junction and a surface region of a small thickness.

According to a variation of the above method, starting material is a plate which is uniformly doped with impurities of a first type, then a diffusion of impurities of the opposite type is carried out from the active surface of the plate until a junction of a determined depth is obtained. Then out-diffusion of said impurities of the opposite type is carried out through said active surface so as to create a concentration gradient of said impurities decreasing towards the surface, said impurities have been chosen for their strong out-diffusion coefficient. As a result of this, a second junction is realized which is gradual and presents the same advantages as the junction obtained by the method described above.

After obtaining a junction by means of an out-diffusion operation, other operations belonging to known technologies may complete the device. For example, a superficial excessive doping may be obtained by ion implantation.

More particularly, an electroluminescent diode having a surface region of the $n$ type and gradual junction may be obtained starting from a plate manufactured from a semiconductor material composed of elements III and V which are uniformly doped with impurities giving the $n$ type and with impurities giving the $p$ type, the latter having a higher out-diffusion level and with a concentration two to ten times higher than that of the impurities giving the $n$ type. The plate is thermally treated in such manner that the impurities giving the $p$ type are out-diffused It is to be noted that said diode structure is very difficult to realize by means of the usual diffusion methods when the diffusion coefficient of the impurities which are to be introduced in the surface region is low, which is the case with numerous dopings giving the $n$ type in the compounds of elements III and V.

In accordance with the doping impurities chosen, out-diffusion may be carried out in a vacuum, in the presence of a gaseous, liquid or solid phase.

According to the out-diffusion method, an electroluminescent diode having a surface region of the $p$ type and a gradual junction may also be obtained starting from a plate of a semiconductor material composed of elements III and V which are uniformly charged with impurities giving the $p$ type and which impurities giving the $n$-type, the latter with a concentration of two to ten times higher than that of the impurities giving the $p$ type. The plate is thermally treated in such manner that mainly atoms of a volatile element V are out-diffused producing a migration of impurities giving the $n$ type and thus resulting in an inversion of the surface layer of $n$ type into the $p$ type. For example, a plate of gallium arsenide obtained by growing according to the Bridgmann method and doped with silicon giving it the $n$ type, is thermally treated until inversion of the type of the surface region at a depth less than 10 microns. The resulting junction is gradual, the surface region very little absorbing for the emittive radiation the luminous efficiency maximum.

What is claimed is:

1. An electroluminescent semiconductor device including a diode and a light emanating surface, comprising
   first and second regions having subsantially uniform equal concentrations of doping centers of a first conductivity type and a concentration gradient of doping centers of a second opposite conductivity type, said first region adjoining said light emanating surface of said device and defining with said second region a $p$-$n$ junction that constitutes said diode, wherein the concentration of said second conductivity type doping centers of said first region decreases continously from the region of said junction to said light emanating surface.

2. An electroluminescent device as in claim 1, wherein said first conductivity type centers comprise donor centers and said second conductivity type centers comprise acceptor centers, said second region having a concentration of said acceptor centers significantly higher than that of said donor centers.

3. An electroluminescent device as in claim 1, wherein said first conductivity type centers comprise acceptor centers and said second conductivity type centers comprise donor centers said second region having a concentration of said donor centers significantly higher than that of said acceptor centers.

4. An electroluminescent device as in claim 1, wherein said first region comprises a third region disposed at a localized part of said light emanating surface, and said second conductivity type doping center concentration so decreases only in part of said second region adjoining said third region.

5. An electroluminescent device as in claim 1, wherein said second region comprises a second conductivity type doping center concentration that is substantially uniform over a major part of the thickness of said second region.

6. An electroluminescent device as in claim 1, wherein said second region comprises a second conductivity type doping center concentration gradient.

7. An electroluminescent device as in claim 1, wherein said semiconductor comprises a material consisting essentially of at least one element of Group III of the Periodic Table of elements and at least one element of Group V thereof.

* * * * *

UNITED STATES PATENT AND TRADEMARK OFFICE
CERTIFICATE OF CORRECTION

PATENT NO. : 3,977,016
DATED : August 24, 1976
INVENTOR(S) : JACQUES LEBAILLY ET AL It is certified that error appears in the above-identified patent and that said Letters Patent are hereby corrected as shown below:

Col. 1, line 34, delete "of";

In the Claims, Claim 8 should read as follows: --An electroluminescent device as in Claim 1, wherein said first region comprises a surface layer adjoining said light emanating surface and having a comparatively small thickness, said surface layer comprising a high concentration of said first conductivity doping centers exceeding that of said first and second regions.

Signed and Sealed this

First Day of February 1977

[SEAL]

Attest:

RUTH C. MASON
*Attesting Officer*

C. MARSHALL DANN
*Commissioner of Patents and Trademarks*